United States Patent
Liew et al.

(10) Patent No.: US 6,207,479 B1
(45) Date of Patent: Mar. 27, 2001

(54) PLACE AND ROUTE METHOD FOR INTEGRATED CIRCUIT DESIGN

(75) Inventors: Boon-Khim Liew; Jing-Meng Liu, both of Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/332,127

(22) Filed: Jun. 14, 1999

(51) Int. Cl.⁷ .................................................. H01L 21/82
(52) U.S. Cl. .................................... 438/129; 438/129
(58) Field of Search .......................... 438/48, 62, 108, 438/129, 128, 130, 599

(56) References Cited

U.S. PATENT DOCUMENTS 5,088,061 * 2/1992 Golnabi et al. ................... 365/189
5,629,860 * 5/1997 Jones et al. ........................ 364/490
5,872,027 * 2/1999 Mizuno ............................. 438/129

* cited by examiner

*Primary Examiner*—David Nelms
*Assistant Examiner*—David Nhu
(74) *Attorney, Agent, or Firm*—Nath & Associates; Harold L. Novick

(57) ABSTRACT

The present invention provides a method of placing and routing metal wires for integrated circuit. In the method, a grid pattern is constructed by a plurality of floors with metal wires The grid size is set to be equal to a metal pitch. However, each via placed in the grid pattern has to be constrained by a checkerboard-like pattern. The checkerboard-like pattern consists of potential via sites and forbidden sites, wherein the potential via sites and the forbidden sites are intervened each other so that each potential via site in a comer of the grid has forbidden sites at its nearest neighbor corners. Furthermore, the connection cells is constructed and placed in a defined via site for connecting the metal wires in individually floor.

17 Claims, 2 Drawing Sheets

PLACE AND ROUTE METHOD FOR INTEGRATED CIRCUIT DESIGN

FIELD OF THE INVENTION

The present invention relates to a method for integrated circuit design, and more specifically, to a method of using a checkerboard pattern to constrain interlayer connection points (contact/via) and a connection cell placed in a via during automatic place and route.

BACKGROUND OF THE INVENTION

As the technology scales to small dimensions, one of the most difficult obstacles to continued scaling is the level to level alignment in lithography, especially in complex structures of metals and contacts. Consequently, the level of contact from one to another for nesting tolerance or for borders used around contacts and the design rule thereof become crucial limitations for densely packed chip.

Most ASICs (application specific integrated circuits), such as microprocessor, graphic-used chip, have a bit less repetition on the transistors than the memory-type integrated circuit. Hence, for approaching the goal of high packed density in a ASIC IC chip suffers a more strict challenge than memory IC chip.

Recently, there are many conventional layout tools have been developed for the microelectronic devices in a ASIC IC chip. For examples, one is the gate array methods, which are best suited to quick, turnaround random logic functions, the other is standard cell system, which improve on the utilization of silicon and range of function available to the designer. In addition, the symbolic layout, such as fixed grid layout, gate matrix layout, or virtual grid symbolic layout, are developed to simplify the complicated layout tasks. No matter what approaches are taken, the final stage of metal wires' layout are still using the grid design rule since it can obtain the highest packed density on a chip as far as currently technology is concerned. The grid layout indicated the metal wires in the same floor are uniform ud and parallel each other, say at a X direction. The next floor of metal wires are placed the same or all in a Y direction. The column metal wires and the row metal wires intersect to construct the grids. Each of the corners of the grids is a potential site for forming a contact/via so as to interconnect the metal wires on each floor.

There are some technology terms and labels presented in this application will be defined here as follows:

1. minimum via size "A" : indicated that the via will be failed because the misalignment of etching or/and lithographic technologies, or the ineffective deposited the metal into the via while the via size is smaller than this value.
2. minimum line extended length "B": indicated a minimum metal wire length, which is measured from a edge of a via to the end of metal wire.
3. minimum line-end spacing "C": is a minimum spacing between two end terminals of two metal lines which are lined up each other.
4. minimum metal wire island "D" : indicated a minimum length defined during layout or it would be failed due to the lithography or the etch process.
5. minimum spacing of metal wires "E": indicated a minimum average spacing between two adjoining and parallel metal wires.
6. minimum width of a metal wire "W": indicated a minimum average width to prevent the discontinuous of the metal wires due to the issues of the topography of structure or step coverage during the wire deposition.
7. grid size G1,G2 or G, wherein G1 or G2 is a size of a grid constructed by column wire and row wire using a conventional method. The grid size represents the minimum feature or placement tolerance that is desired in a given process.
8. pitch "P"; a sum of minimum width of a metal wire and minimum spacing of two adjoining metal wires.

From the forgoing depicted, it is realize that the short or discontinuous of the wires results from the process degradation, such as lithography, etching and deposition, needs to avoid. Furthermore, some electrical performance characteristics such as the electromigration, reliability, power dissipation, transfer delay, and noise isolation, will need to take into account while setting the design rule for layout the wires is done so as to obtain the best possible compromise between performance and yield. In general, the worse condition is set, FIG. 1 shows an example of synoptic layout the metal wires. The metal wires 20 on the upper floor are uniform spaced and parallel each other (along Y direction), the same is the metal wires 30 (but along X direction)on the lower floor. The column metal wires 20 and the row metal wires 30 intersect so that the grids are formed. In the figure, the small circle and square are respectively, the potential site for a via position and a real via defined therein to connect the metal wires 20 and 30 of two floors.

Still referring to FIG. 1, as aforementioned issues discussed, it is found that that to obtain the best possible compromise between performance and yield, the grid size G1 needs to be larger than the sum of A+2×b+C, or grid size G2 needs to be larger than the sum of 0.5×D+C, where the labels "A", "B", "C" and "D" are defined as above. In accordance with the conventional method, the grid size is a larger value chosen from G1 and G2.

Table 1 lists some of relative parameters for 0.25 µm and 0.18 µm feature sizes of the process.

TABLE 1

| Feature size of process | 0.25 µm | 0.18 µm |
| --- | --- | --- |
| Via size A µm | 0.36 | 0.26 |
| Min. line extended length B µm | 0.09 | 0.06 |
| Min. line-end spacing C µm | 0.40 | 0.28 |
| Min. metal wire island D µm | 0.90 | 0.72 |
| Grid size G1 | 0.94 | 0.66 |
| Grid size G2 | 0.85 | 0.64 |

Although above design rule is satisfied for some cases especially for the number of vias is larger, however the design rule set forth in above isn't efficient for the number of the vias not dense. It is because the grid size can't be reduced. The present invention provides a method to resolve above issues.

SUMMARY OF THE INVENTION

An object of the invention provides a metal-wire layout method so that the grid size can be equal to minimum metal pitch, and thus the chip size is reduced.

An another object of the invention is to improve the electromigration reliability.

The present invention provides a method of placing and routing metal wires for integrated circuit. The method comprises of following: at first, a grid pattern is constructed by a plurality of floors with metal wires therein. The metal wires are uniform spaced and parallel each other in each floor. Furthermore, the metal wires in at least one floor are perpendicular to the metals wires in others floor so as to fully utilize the available space in a chip, and to form a set of grids. The grid size is set to be equal to the minimum width of metal wire plus the minimum spacing of two adjoining metal wires. However, each via placed in the grid pattern has to be constrained by a checkerboard-like pattern. The checkerboard-like pattern consists of potential via sites and forbidden sites, wherein the potential via sites and said forbidden sites are intervened each other so that each potential via site in a corner of the grid has forbidden sites at its nearest neighbor corners. Furthermore, the connection cells is constructed and placed in a defined via for connecting the metal wires in individually floor.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

As forgoing depicted in the background of the invention, layout the grid size is currently forced to be equal to worse case design rule. It can satisfy most of the cases but it isn't an optimization design rule. Especially for the number of vias are not dense, or the situation of the wires are mostly longer.

Figure 1:
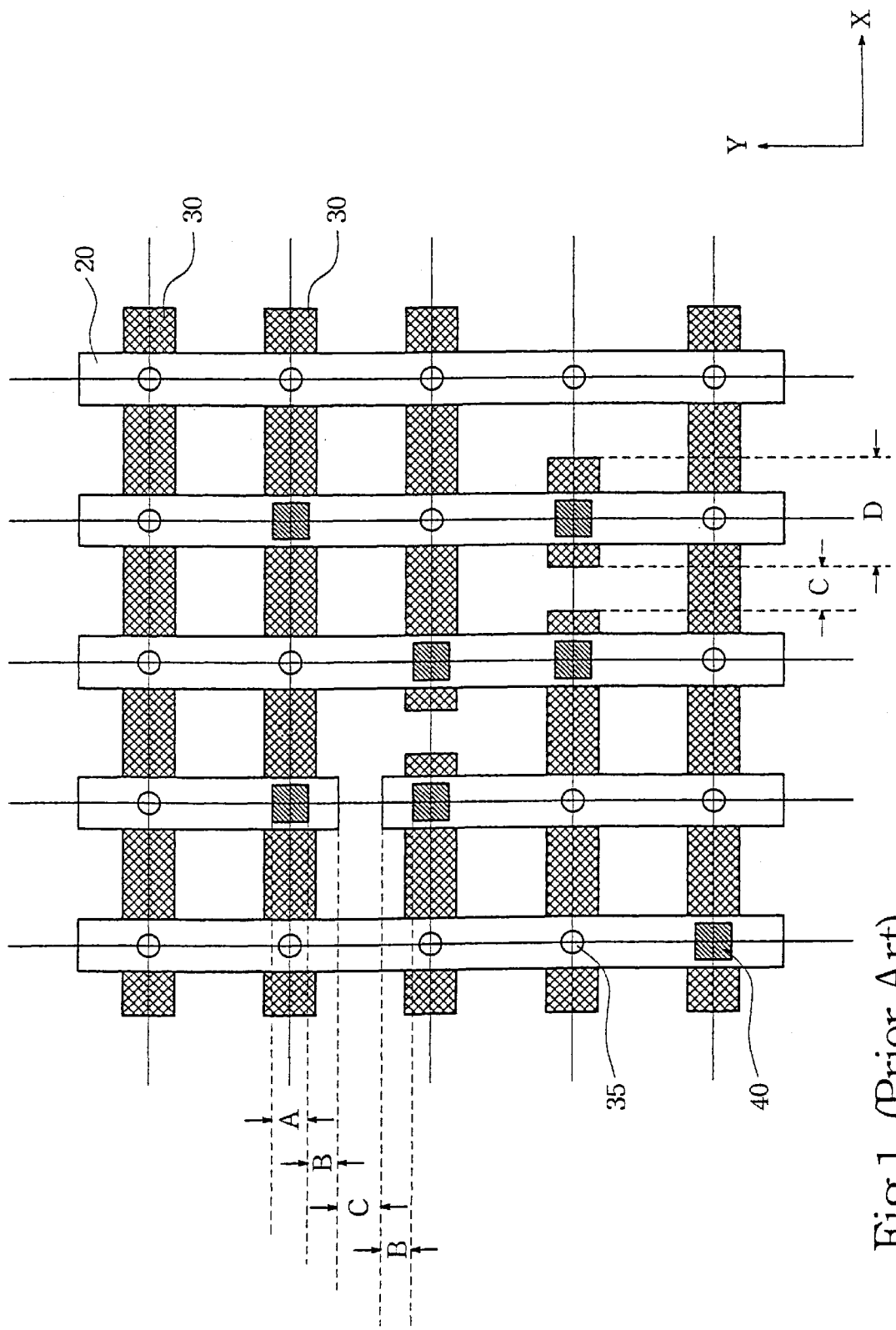
FIG. 1 is a synoptic layout for metal wires in accordance with the prior art.
Figures 2, 2A:
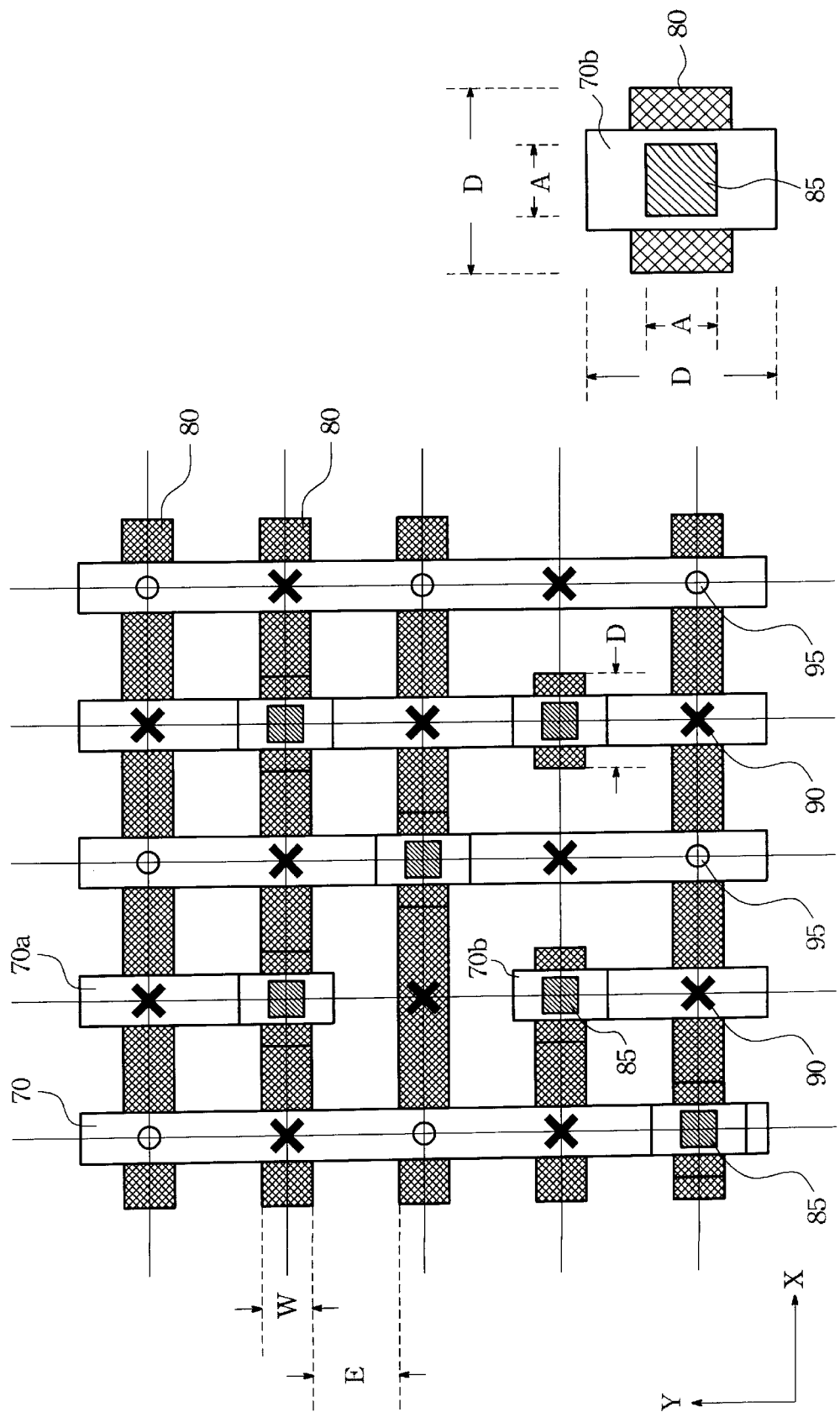
FIG. 2 is a synoptic layout for metal wires in accordance with the present invention.
FIG. 2A is a connection cell for a via in accordance with the present invention.

The method provides a method to reduce the grid size for routing the metal wires. However some of constrains should be noted whenever the layout for polysilicon gate regions, diffusion regions, and isolation regions is conducted. The present method associated some constrains are as following (please refer to FIG. 2 in the meantime):

(1) The metal wires 70 and 80 in each floor are uniformed spaced and parallel each other. The minimum length for a metal wire 70a and 70b has to longer than the minimum length of a wire island D, in addition the grid size G=pitch size P=W+E, where "W" is a minimum wire width, and "E" is a minimum spacing between two adjoining wires. In a preferred embodiment, "W" is about 0.3–0.5 $\mu$m for 0.25 $\mu$m feature size process, and is about 0.20–0.35 $\mu$m for 0.18 $\mu$m feature size process. The "E" is about 0.3–0.5 $\mu$m for 0.25 $\mu$m feature size process, and is about 0.20–0.35 $\mu$m for 0.18 $\mu$m feature size process.

(2) For the purpose to fully utilize the available spaces it is demanded at least one wires in a floor is perpendicular to the wires of the others floors.

(3) A corner is (i.e. an intersection site between a metal wire 70 and a metal wires 80) a potential via site if it is not a forbidden site 90 constrained by a checkerboard-like pattern. The checkerboard like pattern constrain indicated that a corner is set as a allowable site for via (represent by a small square 85), and then its nearest sites have to be a forbidden sites (represent by a cross 90). Further more its second nearest site (represent by a small circle 95) are allowable too . Thus it is similar to the black and white pattern in a checkerboard.

(4) A connection cell is placed in a defined via. A connection cell consists of a via with a minimum size "A" overlapped with a metal island D in both horizontal and vertical directions.

After notice above rules, the transistor cells, isolation cells, diffusion regions can be arranged as conventional method by using whatever design tools is currently used.

Table 2 lists data preferred embodiments, in accordance with the present invention. The improvements for the yield are obvious as compare with the prior art.

TABLE 2

| Feature size $\mu$m | 0.25 | 0.18 |
| --- | --- | --- |
| Minimum width of a metal wire W $\mu$m | 0.40 | 0.28 |
| Minimum spacing of metal wires E $\mu$m | 0.40 | 0.28 |
| Metal island D $\mu$m | 0.90 | 0.72 |
| Grid size G | 0.80 | 0.56 |
| Increment density % | 38 | 39 |

Since via sites have to be constrained by a checkerboard like pattern, thus it is a disadvantage. However the invention provides vital benefits as follows:

(1) Layout grid size can be equal to minimum metal pitch, so that the density is crease, therefore the chip size is reduced;

(2) The line-end short issue is improved (due to none of any adjoining vias is constructed in the invention), as a result, better electromigration reliability is obtained. and thus (3) The yield rate would be substantially increase As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of placement and routing for integrated circuit, said method comprising the steps of:

defining a grid pattern, said grid pattern being constructed by a plurality of floors with metal wires therein, said metal wires being uniform spaced and parallel each other in each floor, and at least one of floors having said metal wires being perpendicular to said metals wires in said others floors, and thus forming a set of grids, each said grid having a size being equal to the minimum width of any one of said metal wires plus the minimum spacing of two adjoining metal wires;

defining corners of each of said grids as vias, so as to connect said metal wires in between said floors, said corners of each of said grids being constrained by a checkerboard-like pattern, said checkerboard-like pattern having potential sites for said vias, and having forbidden sites therein, said potential sites and said forbidden sites being intervening each other; and defining connection cells for a defined vias, placed in said potential site for interconnecting said metal wires.

2. The method of claim 1, further comprising a connection cell placed in said potential site for interconnecting said metal wires while a via is set in said potential site.

3. The method of claims 2, wherein said connected consists of a via having a first metal island overlapping said via in a horizontal direction and a second metal island overlapping said via in a vertical direction.

4. The method of claims 1, wherein said minimum size of said via is about 0.34–0.40 μm for 0.25 μm feature process.

5. The method of claims 1, wherein said minimum size of said via is about 0.26–0.32 μm for 0.18 μm feature process.

6. The method of claims 1, wherein said minimum width of said wire is about 0.30–0.50 μm for 0.25 μm feature process.

7. The method of claims 1, wherein said minimum width of said wire is about 0.20–0.35 μm for 0.18 μm feature process.

8. The method of claims 1, wherein said minimum spacing between two said adjoining wires is about 0.30–0.50 μm for 0.25 μm feature process.

9. The method of claims 1, wherein said minimum spacing between two said adjoining wires is about 0.20–0.35 μm for 0.18 μm feature process.

10. A method of placement and routing for integrated circuit, said method comprising the steps of:

defining a grid pattern, said grid pattern being constructed by a plurality of floors with metal wires therein, said metal wires being uniform spaced and parallel each other in each floor, and at least one of floors having said metal wires being perpendicular to said metals wires in said others floors, and thus forming a set of grids, each said grid having a size being equal to the minimum width of any one of said metal wires plus the minimum spacing of two adjoining metal wires;

defining corners of each of said grids as vias, so as to connect said metal wires in between said floors, said corners of each of said grids being constrained by a checkerboard-like pattern, said checkerboard-like pattern having potential sites for said vias, and having forbidden sites therein, said potential sites and said forbidden sites being intervening each other.

defining connection cells for a defined vias, placed in said potential site for interconnecting said metal wires.

11. The method of claims 10, wherein said connected consists of a via having a first metal island overlapping said via in a horizontal direction and a second metal island overlapping said via in a vertical direction.

12. The method of claims 10, wherein said minimum size of said via is about 0.34–0.40 μm for 0.25 μm feature process.

13. The method of claims 10, wherein said minimum size of said via is about 0.26–0.32 μm for 0.18 μm feature process.

14. The method of claims 10, wherein said minimum width of said wire is about 0.30–0.50 μm for 0.25 μm feature process.

15. The method of claims 10, wherein said minimum width of said wire is about 0.20–0.35 μm for 0.18 μm feature process.

16. The method of claims 10, wherein said minimum spacing between two said adjoining wires is about 0.30–0.50 μm for 0.25 μm feature process.

17. The method of claims 10, wherein said minimum spacing between two said adjoining wires is about 0.20–0.35 μm for 0.18 μm feature process.

* * * * *